(12) United States Patent
Chen

(10) Patent No.: US 7,727,683 B2
(45) Date of Patent: Jun. 1, 2010

(54) HIGH-TRANSMISSION ATTENUATING PSM

(75) Inventor: Chih-Li Chen, Taipei County (TW)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 479 days.

(21) Appl. No.: 11/777,280

(22) Filed: Jul. 12, 2007

(65) Prior Publication Data
US 2008/0274414 A1    Nov. 6, 2008

(30) Foreign Application Priority Data
May 3, 2007    (TW) ............................... 96115718 A

(51) Int. Cl.
G03F 1/00    (2006.01)
(52) U.S. Cl. ............................................................ 430/5
(58) Field of Classification Search ............. 430/5, 430/311, 312, 313, 394
See application file for complete search history.

(56) References Cited

U.S. PATENT DOCUMENTS

| | | | |
|---|---|---|---|
| 6,623,895 B2* | 9/2003 | Chen et al. | 430/5 |
| 6,787,274 B2* | 9/2004 | Park | 430/5 |
| 7,045,255 B2* | 5/2006 | Misaka | 430/5 |

* cited by examiner

*Primary Examiner*—Stephen Rosasco
(74) *Attorney, Agent, or Firm*—Winston Hsu

(57) ABSTRACT

An attenuating PSM includes a quartz substrate, a first dummy pad pattern disposed on the quartz substrate, wherein the first dummy pad pattern is composed of a first phase shifter material layer with a transmission rate of greater than or equal to 15%, and a first opaque pattern disposed at a center area of the first dummy pad pattern. The first opaque pattern has a shape that is analogous to the first dummy pad pattern and surface area of the first opaque pattern is smaller than that of the first dummy pad pattern.

11 Claims, 6 Drawing Sheets

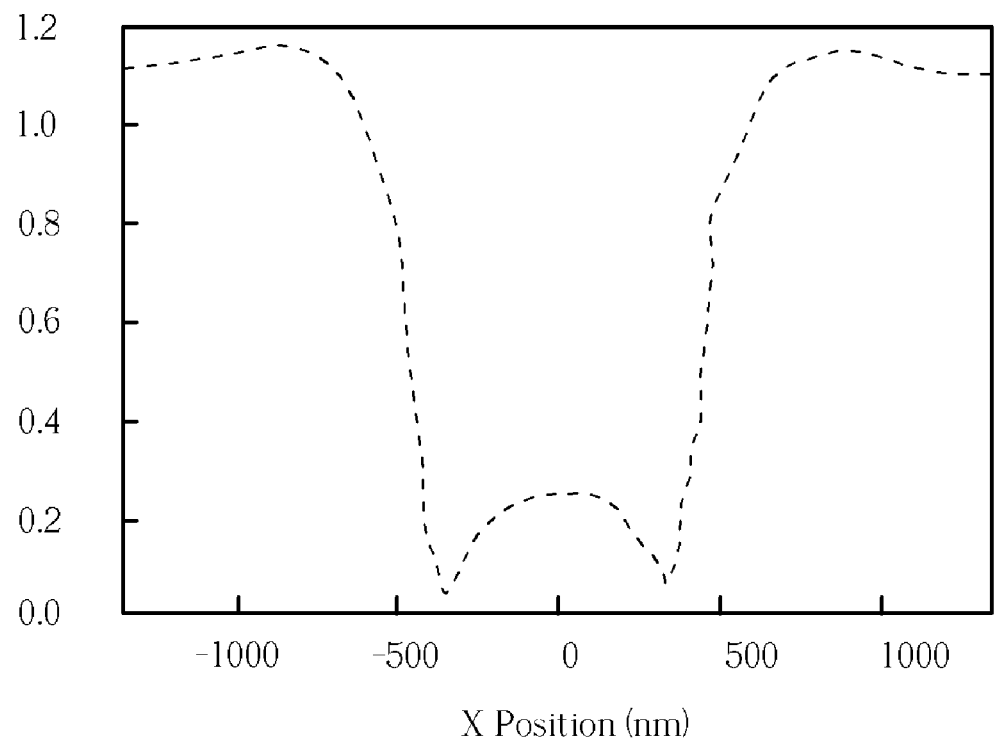
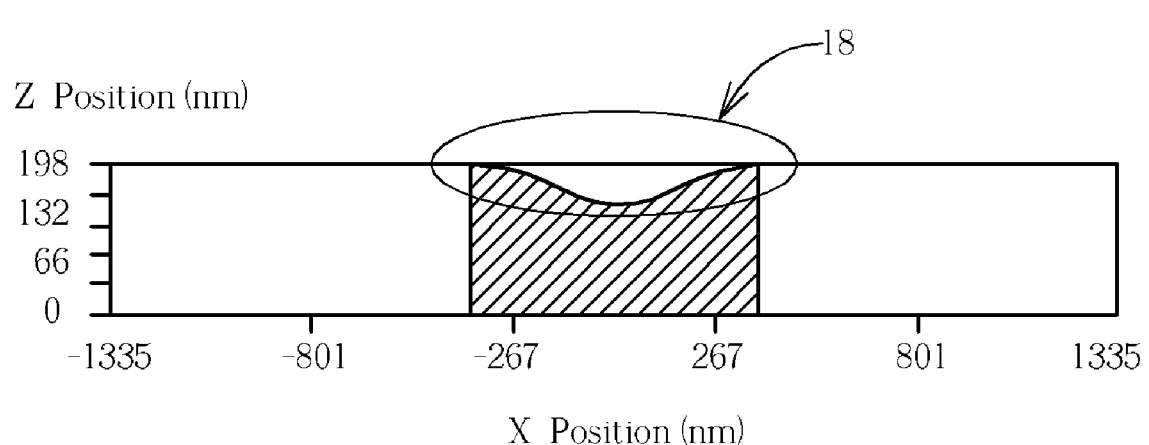
Fig. 2 Prior art

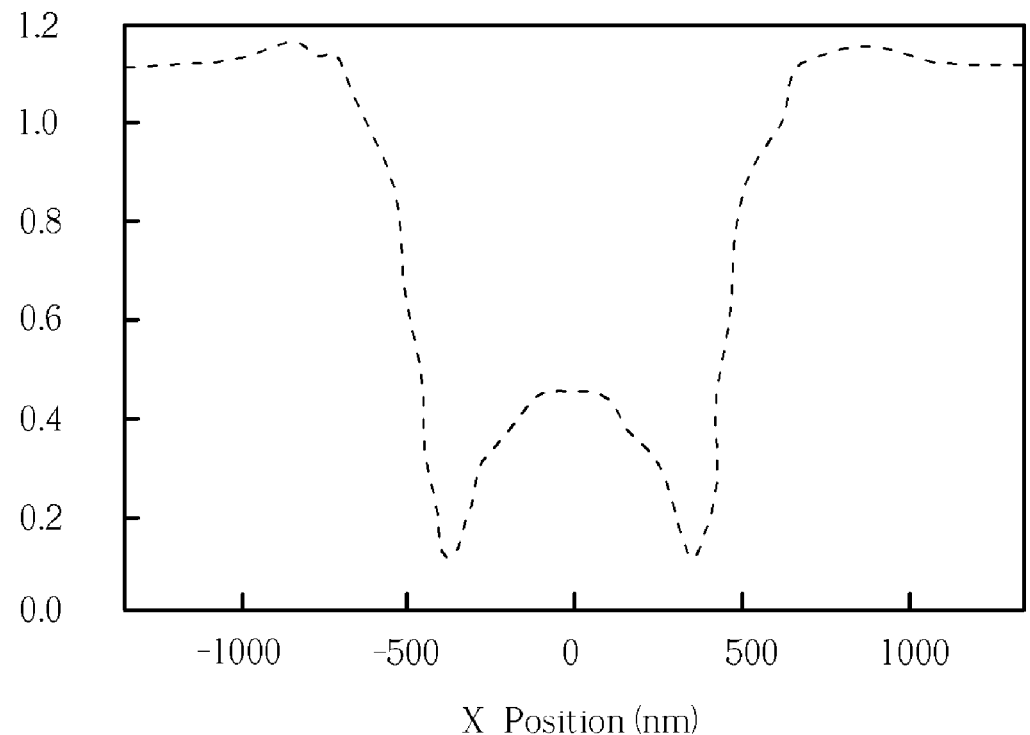
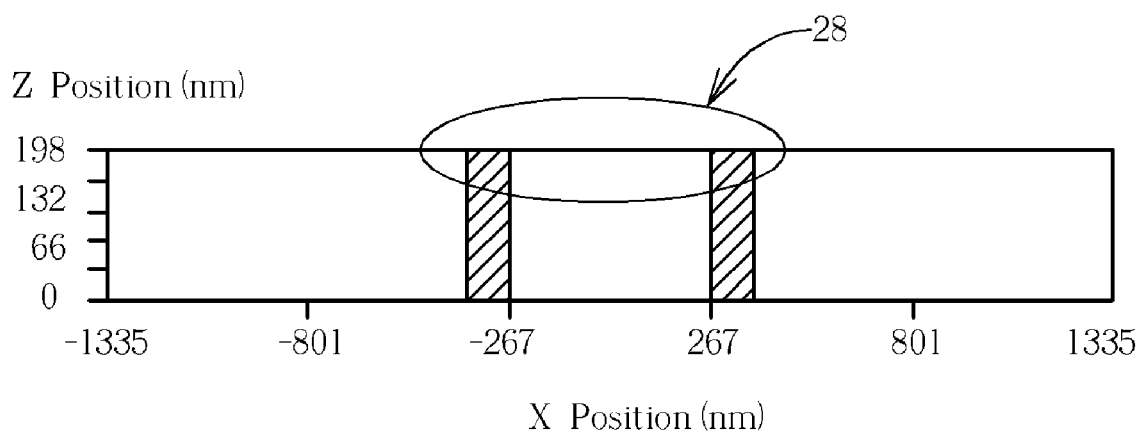
Fig. 3 Prior art

HIGH-TRANSMISSION ATTENUATING PSM

BACKGROUND OF THE INVENTION

1. Field of the Invention

The present invention relates generally to the field of optical lithography and, more particularly, to a high-transmission attenuating phase shift mask (attenuating PSM).

2. Description of the Prior Art

In the circuit making processes, lithographic process has not only been a mandatory technique but also played an important role in limiting feature size. By lithographic process, a wafer producer can precisely and clearly transfer a circuit pattern onto a substrate. In a lithographic process, a designed pattern, such as a circuit pattern or a doping pattern, is created on one or several photo mask, then the pattern on the mask is transferred by light exposure, with a stepper and scanner, onto a substrate.

While the traditional technologies continue to advance at breakneck speed they are becoming quite costly and are no longer able to provide the resolution and depth of focus (DOF) with an acceptable process window on their own. This is a direct result of the Sub-Wavelength environment. Fortunately there is an additional knob the industry can adjust to improve the overall system performance. The field of low $k_1$ lithography includes such techniques as optical proximity correction (OPC), phase shift masks (PSM), off-axis or modified illumination, spatial filters and high contrast resists. These techniques, collectively referred to as Resolution Enhancement Techniques (RETs), work in conjunction with the traditional techniques of decreasing wavelength and increasing NA to extract the highest level of performance possible from the advanced lithography systems.

Central to the resolution enhancement techniques are PSMs. The principle PSMs deployed in the industry include attenuated (usually used for contacts and metal layers) and alternating aperture (used for CD control for gates). The phase shift masks are the masks with additional phase shifter material layers selectively between the metal Cr line patterns. When the light passes through the phase shifter material layer of the phase shift masks, the phase of the electric field of the light is shifted exactly 180°, so the phase difference between the incident light and the shifted light is exactly half-wavelength and destructive interference is therefore formed on the wafer. The interference effect of the diffraction is resolved by the destructive interference and the resolution of the border of the metal lines is greatly enhanced.

At present, the attenuating PSM can be sub-classified into two types: low-transmittance type (T~6%) and high-transmittance type (T>15%). As the transmittance of the attenuating PSM increases, problems arise when using these high-transmittance attenuating PSMs to create some specific patterns. Please refer to FIG. 1 and FIG. 2. FIG. 1 is a planar view illustrating a portion of a high-transmittance type (T=15%) attenuating PSM 1 and a dummy pad pattern 10 thereon. FIG. 2 is the after-exposure simulation result. As shown in FIG. 1, the dummy pad pattern 10 is situated on a quartz substrate 12 and is composed of a phase shifter. The dimension of the dummy pad pattern 10 is 800 nm×800 nm. According to the simulation result as shown in FIG. 2, the central portion of the photoresist corresponding to the dummy pad pattern 10 on the high-transmittance type attenuating PSM 1 collapses after exposure and development, thereby forming a recess defect 18 on the photoresist pattern.

FIG. 3 is the after-exposure simulation result when using a high-transmittance type (T=30%) attenuating PSM to form a dummy pad pattern that is the same as pattern 10 set forth in FIG. 1. As shown in FIG. 3, as the transmittance within the dummy pad pattern 10 increases to 30%, the central portion of the photoresist pattern is completely exposed to form a collapsed central aperture 28. The simulation result indicates that the pattern transfer of dummy pad pattern 10 when using the high-transmittance type (T>15%) attenuating PSM fails.

In light of the above, there is a strong need in this industry to provide an improved attenuating PSM to cope with the situation when using a high-transmittance type (T>15%) attenuating PSM to perform pattern transfer of some specific patterns, particularly those isolated pattern having relatively larger surface area and line pattern having large line width and large space.

SUMMARY OF THE INVENTION

It is therefore one object of the present invention to provide an improved attenuating PSM in order to solve the above-mentioned prior art problems.

According to the claimed invention, an attenuating phase shift mask (PSM) comprises a transparent substrate; a first dummy pad pattern comprising a first phase shifter material layer with a transmittance that is greater or equal to 15%; and a first opaque pattern having a contour conforming to said first dummy pad pattern but being smaller than said first dummy pad pattern, said first opaque pattern being disposed at center of said first dummy pad pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is the after-exposure simulation result.

FIG. 3 is the after-exposure simulation result when using a high-transmittance type (T=30%) attenuating PSM to form a dummy pad pattern that is the same as pattern 10 set forth in FIG. 1.

DETAILED DESCRIPTION

The present invention pertains to an improved high-transmittance type attenuating PSM, which is capable of resolving problems arose when using a high-transmittance type (T>15%) attenuating PSM to perform pattern transfer of some specific patterns, particularly those isolated or semi-isolated patterns having relatively larger surface area and line pattern having large line width and large space.

Figure 1:
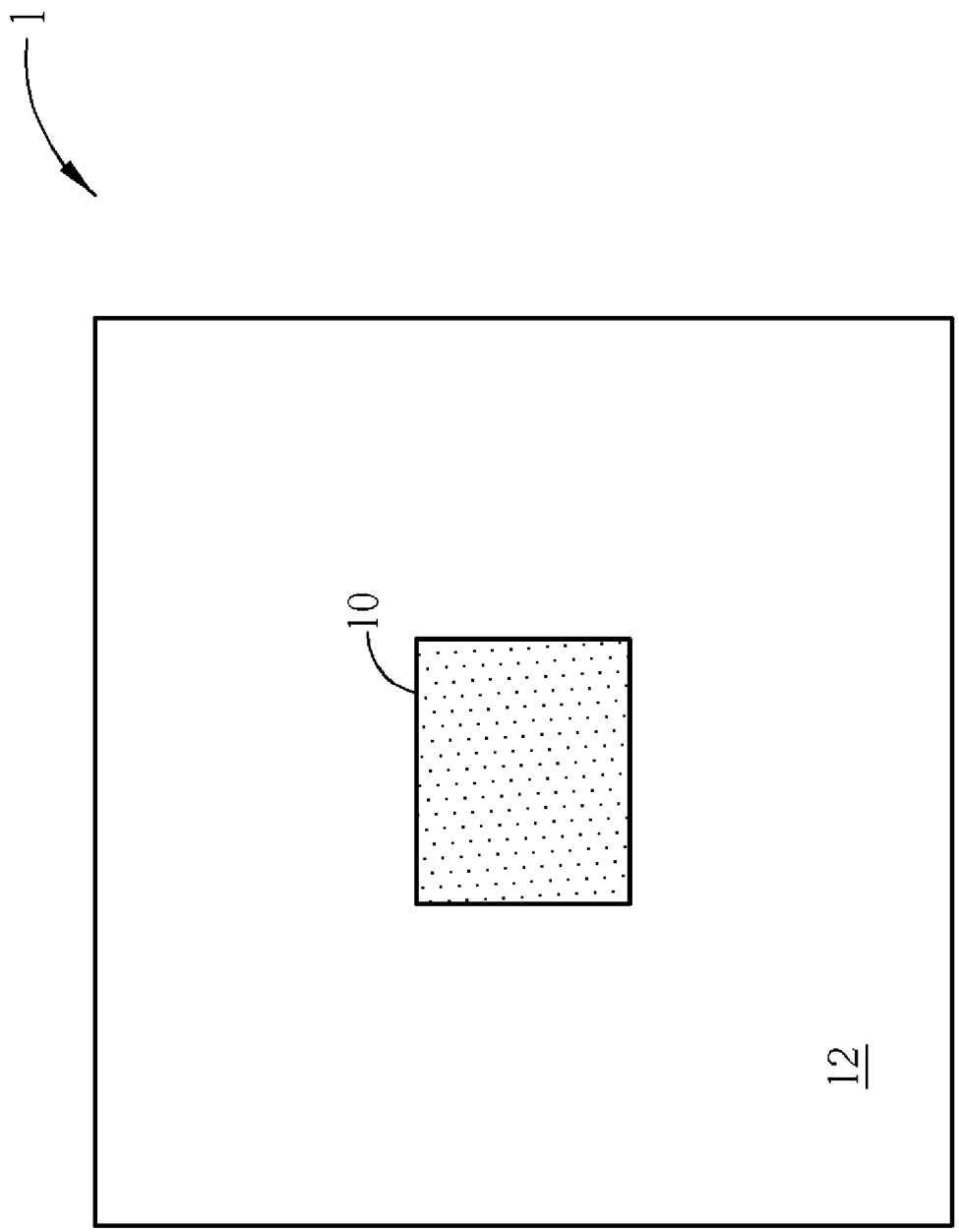
FIG. 1 is a planar view illustrating a portion of a high-transmittance type (T=15%) attenuating PSM and a dummy pad pattern thereon.
Figure 4:
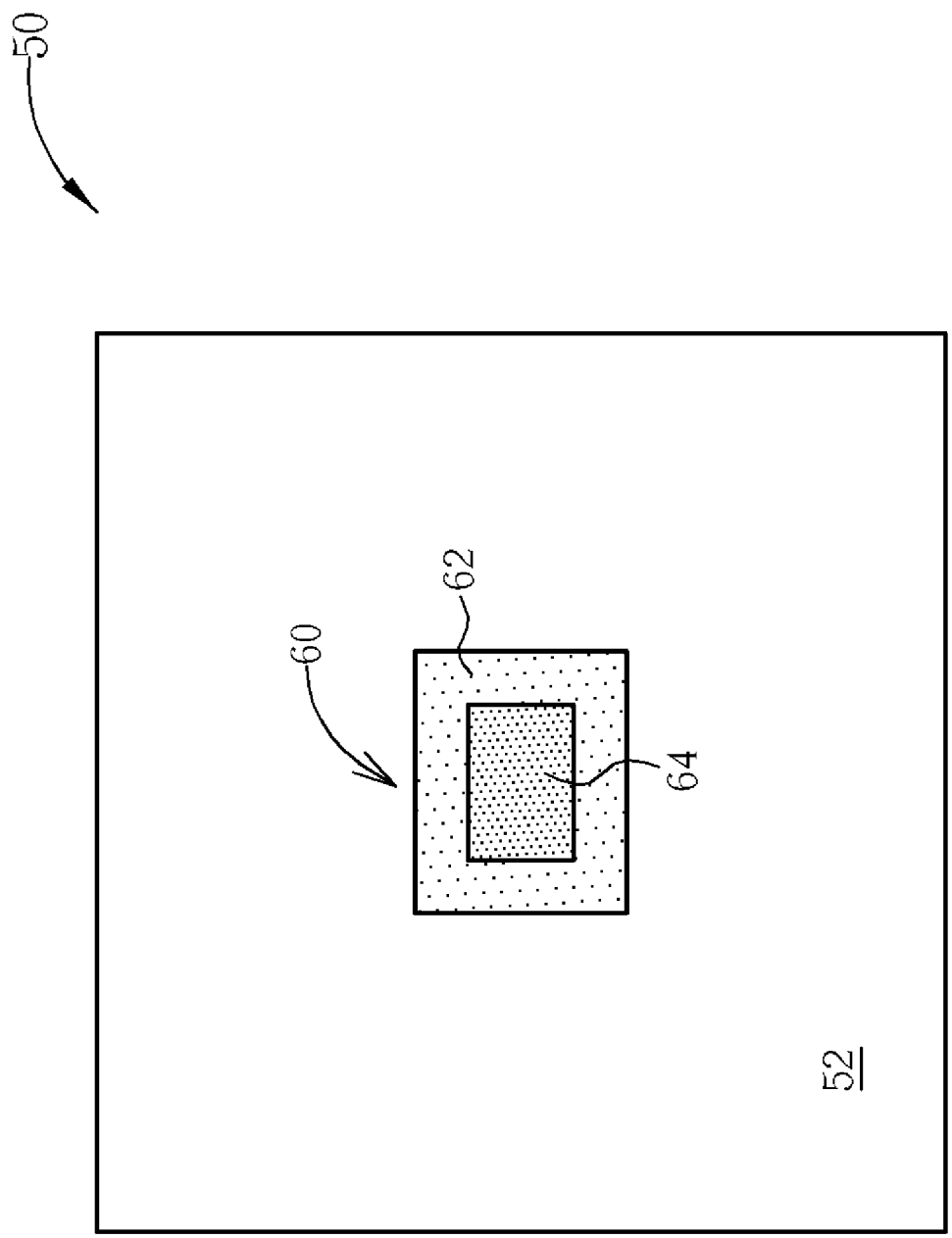
FIG. 4 is a planar view illustrating a portion of a high-transmittance type attenuating PSM and a dummy pad pattern thereon according to this invention.

FIG. 4 is a planar view illustrating a portion of a high-transmittance type attenuating PSM 50 and a dummy pad pattern 60 thereon according to this invention. The dummy pad pattern 60 is to be transferred to a photoresist layer coated on a substrate or a wafer. As shown in FIG. 4, the dummy pad pattern 60 is situated on a quartz substrate 52 and is composed of a phase shifter material layer 62 such as MoSi, but not limited thereto. The dimension of the dummy pad pattern 60 is 800 nm×800 nm in this embodiment. However, the dummy pad pattern 60 may be of other shapes or other sizes.

According to the preferred embodiment of this invention, the dummy pad pattern 60 is an isolated pattern. That is, there are no other patterns situated near the dummy pad pattern 60 on the transparent quartz substrate 52.

One feature of the present invention is that an opaque pattern 64 such as a layer of chrome is added at the center of the dummy pad pattern 60. Preferably, the surface area of the opaque pattern 64 is half the surface area of the dummy pad pattern 60. In this embodiment, the dimension of the opaque pattern 64 is 400 nm×400 nm. According to this invention, the opaque pattern 64 has a contour that conforms to that of the dummy pad pattern 60, but is smaller than dummy pad pattern 60. Preferably, the opaque pattern 64 and the dummy pad pattern 60 are concentric.

Figure 5:
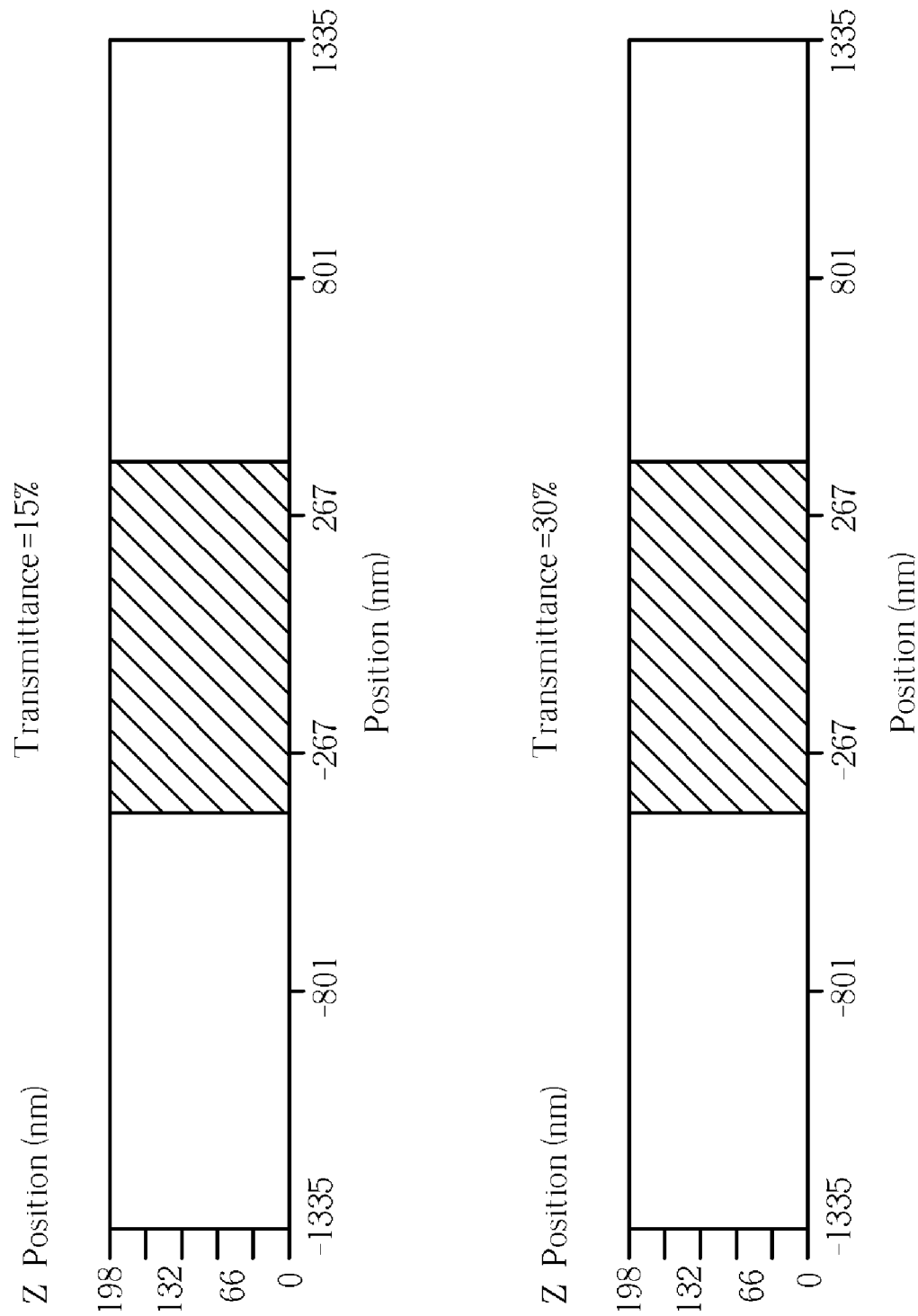
FIG. 5 shows the after-exposure simulation results when using high-transmittance type attenuating PSMs having the layout of FIG. 4 and a transmittance of 15% and 30% respectively.

FIG. 5 shows the after-exposure simulation results when using high-transmittance type attenuating PSMs having a transmittance of 15% and 30% respectively. According to the simulation results of FIG. 5, the present invention high-transmittance type attenuating PSM 50 does not result in defects such as central collapse or collapsed aperture in the corresponding photoresist patterns after exposure.

As previously mentioned, the present invention is particularly suited for the pattern transfer of the isolated pattern having relatively larger surface area and line pattern having large line width and large space, which is capable of resolving central collapse defect or collapsed aperture defect in the photoresist pattern.

Figure 6:
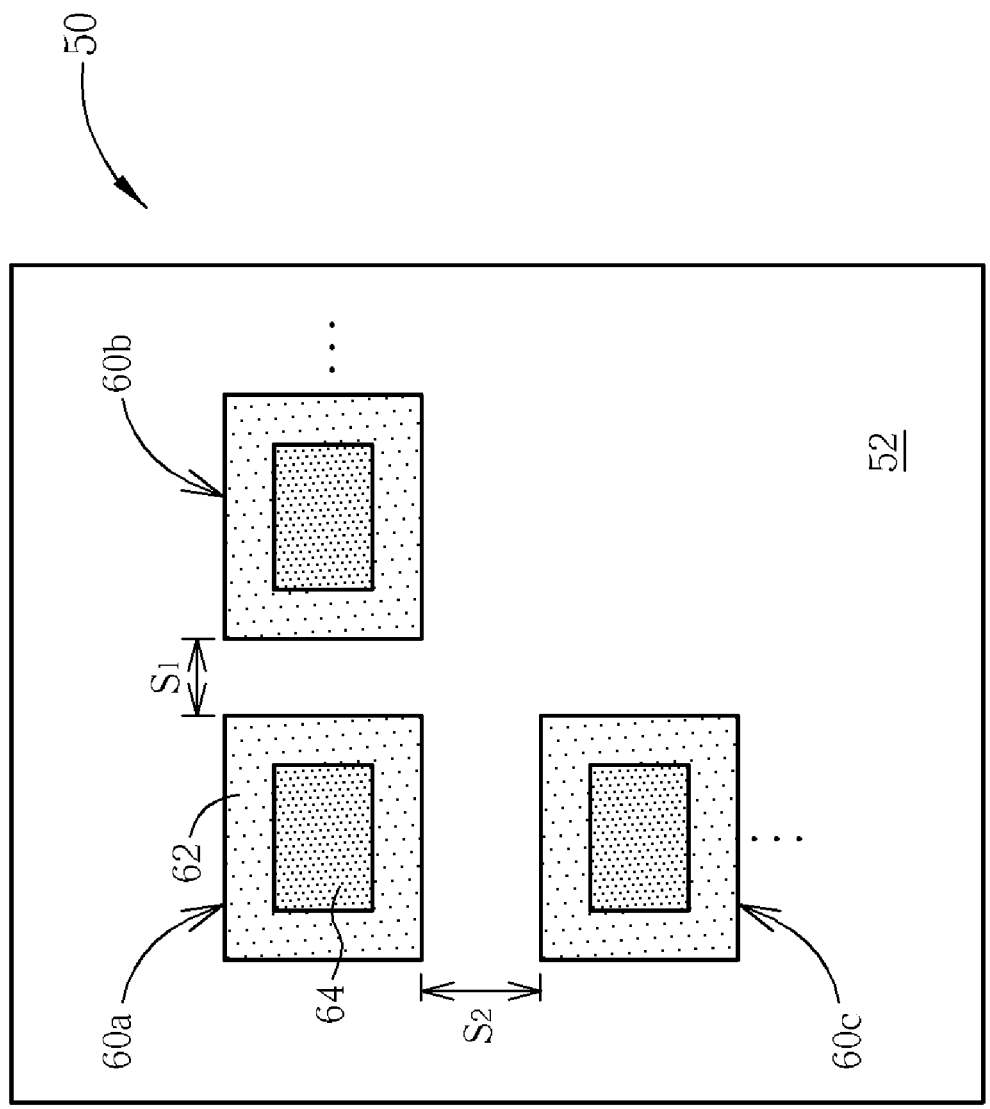
FIG. 6 is a planar view showing a high-transmittance type attenuating PSM having thereon adjacent dummy pad patterns according to another preferred embodiment of this invention.

FIG. 6 is a planar view showing a high-transmittance type attenuating PSM 50 having thereon adjacent dummy pad patterns 60a, 60b and 60c according to another preferred embodiment of this invention. As shown in FIG. 6, the dummy pad patterns 60a, 60b and 60c are all 800 nm×800 nm rectangular-shaped. Each of the dummy pad patterns 60a, 60b and 60c comprises a phase shifter material layer 62 and an opaque pattern 64 disposed at the center of each of the dummy pad patterns 60a, 60b and 60c.

Likewise, the dimension of the opaque pattern 64 is 400 nm×400 nm. In this case, the distance S1 between the dummy pad patterns 60a and 60b is no less than 200 nm and the distance S2 between the dummy pad patterns 60a and 60c is no less than 200 nm.

Those skilled in the art will readily observe that numerous modifications and alterations of the device and method may be made while retaining the teachings of the invention.

What is claimed is:

1. An attenuating phase shift mask (PSM) comprising:
    a transparent substrate;
    a first dummy pad pattern comprising a first phase shifter material layer with a transmittance that is greater or equal to 15%; and
    a first opaque pattern having a contour conforming to said first dummy pad pattern but being smaller than said first dummy pad pattern, said first opaque pattern being disposed at center of said first dummy pad pattern.

2. The attenuating PSM according to claim 1 wherein the transparent substrate comprises a quartz substrate.

3. The attenuating PSM according to claim 1 wherein said first dummy pad pattern is an isolated pattern.

4. The attenuating PSM according to claim 1 wherein said first phase shifter material layer comprises MoSi.

5. The attenuating PSM according to claim 1 wherein said first opaque pattern comprises chrome.

6. The attenuating PSM according to claim 1 wherein said first opaque pattern has a surface area that is half that of said first dummy pad pattern.

7. The attenuating PSM according to claim 1 wherein said first dummy pad pattern has a dimension of 800 nm×800 nm.

8. The attenuating PSM according to claim 1 wherein said first opaque pattern has a dimension of 400 nm×400 nm.

9. The attenuating PSM according to claim 1 wherein said first opaque pattern and said first dummy pad pattern are concentric.

10. The attenuating PSM according to claim 1 wherein a second dummy pad pattern is disposed near said first dummy pad pattern, and wherein a distance between said first dummy pad pattern and said second dummy pad pattern is no less than 200 nm.

11. The attenuating PSM according to claim 10 wherein said second dummy pad pattern comprises a second phase shifter material layer with a transmittance that is greater or equal to 15% and a second opaque pattern disposed at center of said second dummy pad pattern.

* * * * *